United States Statutory Invention Registration [19]

[11] Reg. Number: H832

Dixon, Jr. [43] Published: Oct. 2, 1990

[54] PLANAR MONOLITHIC SELF-OSCILLATING MIXER

[75] Inventor: Samuel Dixon, Jr., Neptune, N.J.

[73] Assignee: The United States of America as represented by the Secretary of the Army, Washington, D.C.

[21] Appl. No.: 408,848

[22] Filed: Sep. 15, 1989

[51] Int. Cl.[5] ..... H04B 1/26

[52] U.S. Cl. ..... 455/327

*Primary Examiner*—Thomas H. Tarcza
*Assistant Examiner*—Linda J. Wallace
*Attorney, Agent, or Firm*—Michael J. Zelenka; John M. O'Meara

[57] ABSTRACT

A planar monolithic self-oscillating mixer for millimeter wave applications is formed on a gallium arsenide substrate. A via hole extends from the bottom surface to the top surface of the substrate. Metal is plated on the bottom surface of the substrate and in the via hole forming a heat sink. Above the heat sink are disposed three gallium arsenide layers—an N layer between two N+ layers. The top layer has a metal connection formed thereon. The gallium aresenide layers are epitaxially deposited using vapor phase techniques. Unwanted portions of these layers are mesa etched away. A radio frequency microstrip transmission line is disposed on the upper surface of the substrate. This transmission line is gap coupled to the Gunn diode and extends to one edge of the substrate. An intermediate frequency microstrip transmission line is connected to the metal connection on the top N+ layer. This line has a portion disposed on the upper surface of the substrate and extends to the opposite edge of the substrate. Included in the intermediate frequency transmission line is a low pass filter and a beam lead capacitor. A bias line disposed on the substrate extends from one side and is connected to the intermediate frequency transmission line between the beam lead capacitor and the low pass filter.

6 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PLANAR MONOLITHIC SELF-OSCILLATING MIXER

The invention described herein may be manufactured, used and licensed by or for the Government for Governmental purposes without the payment to me of any royalties thereon.

BACKGROUND OF THE INVENTION

1. Field of the Invention

This invention relates to a planar monolithic self-oscillating mixer in the millimeter wave frequency range and the manner in which it is fabricated.

2. Description of Related Art

J. C. Chen et al in an article entitled "Millimeter-Wave Monolithic Gunn Oscillators" disclose the design and fabrication of a monolithic GaAs Gunn oscillator using a flip chip design.

Mixing is defined as the conversion of a low power level signal from one frequency to another by combining it with a higher power (local oscillator) signal in a nonlinear device. In general, mixing produces a large number of sum and difference frequencies. Usually, the difference frequency between signal and local oscillator (the intermediate frequency) is of interest and is at a low power level.

Conventional Schottky-barrier type mixers require two major elements—mixer diodes of the rectifier type and a separate local oscillator. In the present invention a self-mixing oscillator is provided which eliminates the separate mixer diodes.

SUMMARY OF THE INVENTION

A via hole is formed in a gallium arsenide substrate extending from the bottom surface to the top surface. Metal is plated on the bottom surface of the substrate and in the via hole to form a heat sink. Above the heat sink are disposed three gallium arsenide layers—an N layer between two N+ layers. The top layer has a metal connection formed thereon. The gallium arsenide layers are epitaxially deposited using vapor phase techniques. Unwanted portions of these layers are mesa etched away. The Gunn effect occurs in the N layer. A radio frequency microstrip transmission line is disposed on the upper surface of the substrate. This transmission line is gap coupled to the Gunn diode and extends to one edge of the substrate. An intermediate frequency microstrip transmission line is connected to the metal connection on the top N+ layer. This line has a portion disposed on the upper surface cf the substrate and extends to the opposite edge of the substrate. Included in the intermediate frequency transmission line is a low pass filter and a beam lead capacitor. A bias line disposed on the substrate extends from one side and is connected to the intermediate frequency transmission line between the beam lead capacitor and the low pass filter.

It is an object of this invention to a planar monolithic device which performs both as a self-oscillator producing predetermined radio frequency energy and as a mixer producing intermediate frequecy energy.

In accordance with this and other objects, which will become apparent hereafter, the instant invention will now be described with reference to the accompanying drawings.

DETAILED DESCRIPTION OF THE INVENTION

Figure 1:
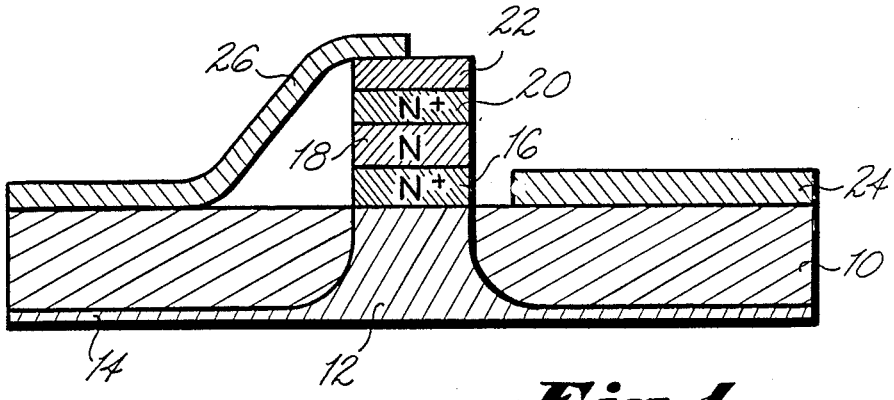
FIG. 1 is a cross-section taken on the line 1—1 of FIG. 2 of a planar monolithic self-oscillating mixer in accordance with the invention.
Figure 2:
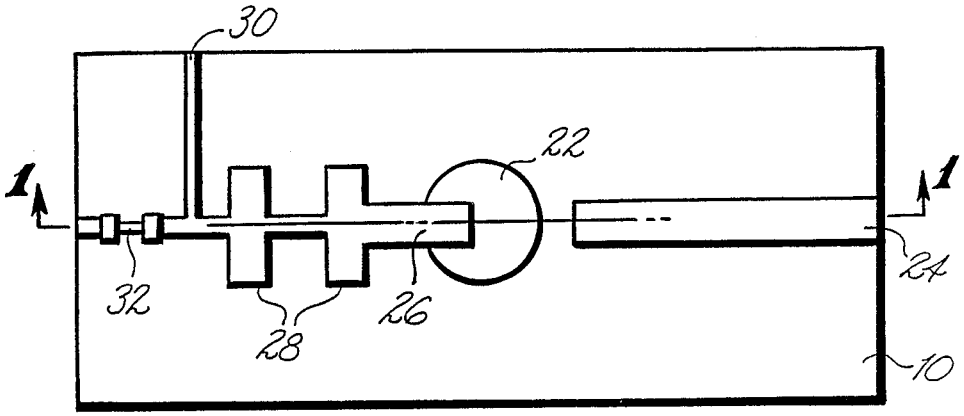
FIG. 2 is a plan view of the planar monolithic self-oscillating mixer of FIG. 1.

Referring to FIGS. 1 and 2, substrate 10 of the planar monolithic self-oscillating mixer is formed of semi-insulating gallium arsenide GaAs. Via hole 12 is opened in body 10 and metal 14 is plated on the bottom of body 10 and in via hole 12 to serve as a heat sink. A first N+ gallium arsenide layer 16 doped to $2.0\times10^{18}$ $cm^{-3}$ is epitaxilly deposited on substrate 10 using vapor phase techniques. A second N gallium arsenide layer 18 doped to approximately $2.0\times10^{15}$ $cm^{-3}$ is similarly deposited on layer 16, and a third N+gallium arsenide layer 20 is deposited on layer 18. The unwanted portions of layers 16-20 are mesa etched away leaving the central plateau which provides the diode geometry. Ohmic metal is plated on layer 20 to form the top metal contact 22 by selective electron beam and gold electroplating techniques. The Gunn effect takes place in layer 18.

The monolithic Gunn diode is gap coupled to microstrip output transmission line 24. This transmission line also carries returning signals. One end of microstrip line 26 is connected to top contact 22. The radio frequency energy is prevented from propagating in the opposite direction by low pass filter 28. Bias line 30 carries the direct current bias. Beam lead capacitor 32 blocks the DC bias, but will pass the intermediate frequency.

Application of DC bias causes self-oscillation of this transferred-electron oscillator at a predetermined frequency in the millimeter wave frequency range (30 to 300 GHz). This RF energy can be radiated into space by coupling with an antenna. When the energy strikes a metal target it is reflected back to the origin and will be mixed in the Gunn diode with radio frequency to create a difference frequency which is an intermediate frequency that will be passed by low pass filter 28. Inherent nonlinearities in the oscillator result in the returned energy being at a different frequency than that being produced in the oscillator so that self-mixing occurs. The intermediate frequency is subsequently processed for range, elevation and other data. The characteristic low noise of this gallium arsenide device, together with its low cost make it an ideal candidate for application to smart munitions, communications and electronic warfare systems in the millimeter wave range. Moreover, the receiving electronics can be less complex.

The fabrication techniques employed are well known to those in the art. The resulting planar monolithic self-oscillating mixer is a low cost device.

While the instant invention has been shown and described herein in what is conceived to be the most practical and preferred embodiment, it is recognized that departures may be made therefrom within the scope of the invention, which is therefore not to be limited to the details disclosed herein, but is to be afforded the full scope of the claims so as to embrace any and all equivalent apparatus and articles.

I claim:

1. A planar monolithic self-oscillating mixer for millimeter wave applications comprising:

a gallium arsenide substrate having a bottom surface and a top surface;

a via hole extending from said bottom surface to said top surface of said substrate;

a metal plating on said bottom surface of said substrate and in said via hole;

a first N+ gallium arsenide layer disposed above said via hole at said top surface of said substrate;

a N gallium arsenide layer disposed on said first N+ gallium arsenide layer;

a second N+ gallium arsenide layer disposed on said N gallium arsenide layer;

said first and second N+ gallium arsenide layers and said N gallium arsenide layer forming a plateau having an upper surface;

a radio frequency transmission line disposed on said upper surface of said substrate having one end adjacent to but spaced from said plateau and extending to one edge of said substrate;

an intermediate frequency transmission line having one end connected to the upper surface of said plateau and extending to an edge of said substrate opposite to said one edge;

a portion of said intermediate frequency transmission line being disposed on said upper surface of said substrate; and a bias line connected to said intermediate frequency transmission line and extending to an edge of said substrate.

2. A planar monolithic self-oscillating mixer for millimeter wave applications in accordance with claim 1 further including:

a low pass filter in said intermediate frequency transmission line, whereby radio frequency will not propagate past said low pass filter.

3. A planar monolithic self-oscillating mixer for millimeter wave applications in accordance with claim 1 further including:

a capacitor in said intermediate frequency transmission line disposed between said connection of said bias line to said intermediate frequency transmission line and said edge of said substrate opposite to said one edge.

4. A planar monolithic self-oscillating mixer for millimeter wave applications in accordance with claim 3 wherein:

said capacitor is a beam lead capacitor.

5. A planar monolithic self-oscillating mixer for millimeter wave applications comprising:

a gallium arsenide substrate having a bottom surface and a top surface;

a via hole extending from said bottom surface to , said top surface of said substrate;

a metal plating on said bottom surface of said substrate and in said via hole;

a first N+ gallium arsenide layer disposed above said via hole at said top surface of said substrate;

a N gallium arsenide layer disposed on said first N+ gallium arsenide layer;

a second N+ gallium arsenide layer disposed on said N gallium arsenide layer;

said first and said second N+ gallium arsenide layers and said N gallium arsenide layer forming a plateau having an upper surface;

a radio frequency transmission line disposed on said upper surface of said substrate having one end adjacent to but spaced from said plateau and extending to one edge of said substrate;

an intermediate frequency transmission line having one end connected to the upper surface of said plateau and extending to an edge of said substrate opposite to said one edge;

a low pass filter in said intermediate frequency transmission line;

a portion of said intermediate frequency transmission line being disposed on said upper surface of said substrate;

a bias line connected to said intermediate frequency transmission line and extending to an edge of said substrate; and a beam lead capacitor in said intermediate frequency transmission line disposed between said connection of said bias line to said intermediate frequency transmission line and said edge of said substrate opposite to said one edge.

6. A method of fabricating a planar monolithic self-oscillating mixer on a semi-insulating gallium arsenide substrate having a bottom surface and a top surface comprising the steps of:

forming a via hole in said substrate extending from said bottom surface to said top surface;

plating metal on said bottom surface of said substrate and in said via hole to form a heat sink;

epitaxially depositing a first N+ gallium arsenide layer on said top surface of said substrate;

epitaxially depositing a N gallium arsenide layer on said first N+ gallium arsenide layer;

epitaxially depositing a second N+ gallium arsenide layer on said N layer;

mesa etching away said N+ and N layers in areas not above said heat sink to form a plateau;

plating ohmic metal on said second N+ layer to form a contact;

disposing a microstrip radio frequency transmission line on said top surface of said substrate with one end adjacent to but spaced from said plateau and extending to one edge of said substrate;

connecting one end of a microstrip intermediate frequency line having a low pass filter and a beam lead capacitor therein to said contact and disposing a portion of said intermediate frequency line on said top surface of said substrate extending to an edge of said substrate opposite said one edge;

connecting a bias line to said intermediate frequency transmission line between said low pass filter and said beam lead capacitor and extending said bias line to an edge of said substrate.

* * * * *